(12) United States Patent
Laven et al.

(10) Patent No.: US 9,666,663 B2
(45) Date of Patent: May 30, 2017

(54) SEMICONDUCTOR DEVICE WITH CELL TRENCH STRUCTURES AND CONTACTS AND METHOD OF MANUFACTURING A SEMICONDUCTOR DEVICE

(71) Applicant: Infineon Technologies AG, Neubiberg (DE)

(72) Inventors: Johannes Georg Laven, Taufkirchen (DE); Maria Cotorogea, Taufkirchen (DE); Hans-Joachim Schulze, Taufkirchen (DE); Haybat Itani, Villach (AT); Erich Griebl, Dorfen (DE); Andreas Haghofer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/963,312

(22) Filed: Aug. 9, 2013

(65) Prior Publication Data

US 2015/0041962 A1    Feb. 12, 2015

(51) Int. Cl.
*H01L 29/78*  (2006.01)
*H01L 29/06*  (2006.01)
(Continued)

(52) U.S. Cl.
CPC .............. *H01L 29/06* (2013.01); *H01L 21/22* (2013.01); *H01L 21/265* (2013.01);
(Continued)

(58) Field of Classification Search
CPC ............. H01L 29/0657; H01L 29/0661; H01L 29/6609; H01L 21/76232; H01L 21/764;
(Continued)

(56) References Cited

U.S. PATENT DOCUMENTS 4,893,160 A    1/1990  Blanchard
4,985,741 A    1/1991  Bauer et al.
(Continued)

FOREIGN PATENT DOCUMENTS

CN    1726596 A    1/2006
CN    1941417 A    4/2007
(Continued)

OTHER PUBLICATIONS

Sumitomo, M., et al, "Low loss IGBT with Partially Narrow Mesa Structure (PNM-IGBT)," Proceedings of the 2012 24th International Symposium on Power Semiconductor Devices and ICs, Jun. 3-7, 2012, pp. 17-20, Bruges.
(Continued)

*Primary Examiner* — Eric Ward
*Assistant Examiner* — Eric Ashbahian
(74) *Attorney, Agent, or Firm* — Murphy, Bilak & Homiller, PLLC (57) ABSTRACT

First and second cell trench structures extend from a first surface into a semiconductor substrate. The first cell trench structure includes a first buried electrode and a first insulator layer between the first buried electrode and a semiconductor mesa separating the first and second cell trench structures. A capping layer covers the first surface. The capping layer is patterned to form an opening having a minimum width larger than a thickness of the first insulator layer. The opening exposes a first vertical section of the first insulator layer at the first surface. An exposed portion of the first insulator layer is removed to form a recess between the semiconductor mesa and the first buried electrode. A contact structure is in the opening and the recess. The contact structure electrically connects both a buried zone in the semiconductor mesa and the first buried electrode and allows for narrower semiconductor mesa width.

7 Claims, 9 Drawing Sheets

(51) Int. Cl.
  *H01L 21/22* (2006.01)
  *H01L 21/265* (2006.01)
  *H01L 29/40* (2006.01)
  *H01L 29/417* (2006.01)
  *H01L 29/66* (2006.01)

(52) U.S. Cl.
  CPC ...... *H01L 29/407* (2013.01); *H01L 29/41766* (2013.01); *H01L 29/66727* (2013.01); *H01L 29/66734* (2013.01); *H01L 29/7813* (2013.01); *H01L 21/26586* (2013.01)

(58) Field of Classification Search
  CPC ... H01L 29/76; H01L 29/7813; H01L 29/407; H01L 29/66734; H01L 29/41766; H01L 29/41741; H01L 29/7831; H01L 29/404; H01L 29/4232; H01L 29/66666; H01L 29/7395; H01L 29/7802; H01L 29/7827; H01L 21/823487
  USPC .................. 257/623, E21.382, E21.383, 328
  See application file for complete search history.

(56) References Cited

U.S. PATENT DOCUMENTS

| | | | |
|---|---|---|---|
| 5,366,914 | A | 11/1994 | Takahashi et al. |
| 5,751,024 | A | 5/1998 | Takahashi |
| 5,973,160 | A | 10/1999 | Poss et al. |
| 6,040,600 | A | 3/2000 | Uenishi et al. |
| 6,218,217 | B1 | 4/2001 | Uenishi et al. |
| 6,521,538 | B2 | 2/2003 | Soga et al. |
| 6,566,691 | B1 | 5/2003 | Inoue et al. |
| 6,710,403 | B2 | 3/2004 | Sapp |
| 6,750,508 | B2 | 6/2004 | Omura et al. |
| 6,800,897 | B2 * | 10/2004 | Baliga ........................ 257/328 |
| 6,882,004 | B2 | 4/2005 | Zundel et al. |
| 7,041,559 | B2 | 5/2006 | Baliga |
| 7,078,740 | B2 | 7/2006 | Yamaguchi et al. |
| 7,423,316 | B2 | 9/2008 | Kawaji et al. |
| 7,456,487 | B2 | 11/2008 | Ogura et al. |
| 7,546,487 | B2 | 6/2009 | Marisetty et al. |
| 7,675,113 | B2 | 3/2010 | Sakamoto et al. |
| 7,986,003 | B2 | 7/2011 | Aono et al. |
| 8,120,074 | B2 | 2/2012 | Schulze et al. |
| 8,178,701 | B2 | 5/2012 | Selifonov |
| 8,178,947 | B2 * | 5/2012 | Takahashi ........... H01L 29/7397 257/133 |
| 8,222,681 | B2 | 7/2012 | Schulze et al. |
| 8,299,539 | B2 | 10/2012 | Kouno |
| 8,319,314 | B2 | 11/2012 | Ogura et al. |
| 2002/0179976 | A1 | 12/2002 | Takahashi |
| 2004/0009643 | A1 | 1/2004 | Blanchard |
| 2004/0014451 | A1 | 1/2004 | Sapp et al. |
| 2004/0079989 | A1 | 4/2004 | Kaneko et al. |
| 2004/0173813 | A1 | 9/2004 | Chang |
| 2006/0060916 | A1 | 3/2006 | Girdhar et al. |
| 2007/0194374 | A1 * | 8/2007 | Bhalla et al. .................. 257/330 |
| 2007/0272978 | A1 | 11/2007 | Mauder et al. |
| 2008/0179662 | A1 | 7/2008 | Hshieh |
| 2008/0265315 | A1 | 10/2008 | Mauder et al. |
| 2009/0114982 | A1 | 5/2009 | Saka et al. |
| 2009/0140327 | A1 | 6/2009 | Hirao et al. |
| 2009/0206924 | A1 * | 8/2009 | Zeng .................. H01L 29/0634 327/581 |
| 2010/0078707 | A1 | 4/2010 | Haeberlen et al. |
| 2010/0171173 | A1 | 7/2010 | Hsieh et al. |
| 2010/0193796 | A1 | 8/2010 | Nakano |
| 2010/0258855 | A1 | 10/2010 | Yilmaz et al. |
| 2010/0289032 | A1 | 11/2010 | Zhang et al. |
| 2011/0101416 | A1 | 5/2011 | Schulze et al. |
| 2011/0248340 | A1 | 10/2011 | Hsieh |
| 2011/0254088 | A1 | 10/2011 | Darwish et al. |
| 2011/0298056 | A1 | 12/2011 | Ning et al. |
| 2011/0303925 | A1 | 12/2011 | Nishimura et al. |
| 2011/0316074 | A1 * | 12/2011 | Oota ........................... 257/330 |
| 2012/0025199 | A1 | 2/2012 | Chen et al. |
| 2012/0032258 | A1 | 2/2012 | Zeng et al. |
| 2012/0056241 | A1 | 3/2012 | Sumitomo et al. |
| 2012/0098030 | A1 | 4/2012 | Schulze et al. |
| 2012/0187474 | A1 | 7/2012 | Rexer et al. |
| 2012/0313139 | A1 | 12/2012 | Matsuura et al. |
| 2012/0319199 | A1 * | 12/2012 | Zeng .................... H01L 29/407 257/334 |
| 2012/0322217 | A1 | 12/2012 | Yeh et al. |
| 2013/0248992 | A1 * | 9/2013 | Padmanabhan et al. ..... 257/331 |
| 2014/0042525 | A1 * | 2/2014 | Darwish ............ H01L 29/4236 257/329 |
| 2014/0061719 | A1 | 3/2014 | Takei |
| 2014/0332844 | A1 | 11/2014 | Ding et al. |

FOREIGN PATENT DOCUMENTS

| | | |
|---|---|---|
| CN | 101185169 A | 5/2008 |
| CN | 101266948 A | 9/2008 |
| CN | 102856208 A | 1/2013 |
| DE | 102004057791 A1 | 6/2006 |
| DE | 102006049043 B4 | 3/2011 |
| DE | 102005052734 B4 | 2/2012 |
| EP | 0881692 A2 | 12/1998 |
| EP | 1353385 A1 | 10/2003 |

OTHER PUBLICATIONS

Blank, O., "Semiconductor Device Including a Gate Trench and a Source Trench," U.S. Appl. No. 13/856,689, filed Apr. 4, 2013.
Nakano, H et al., "600V trench-gate IGBT with Micro-P structure", 21st International Symposium on Power Semiconductor Devices & IC's, Jun. 14-18, 2009, pp. 132-135, Barcelona.
Sumitomo, M et al., "Injection Control Technique for High Speed Switching with a double gate PNM-IGBT", Proceedings of the 25th International Symposium on Power Semiconductor Devices & ICs, May 2013. pp. 33-36, Kanazawa.

* cited by examiner

SEMICONDUCTOR DEVICE WITH CELL TRENCH STRUCTURES AND CONTACTS AND METHOD OF MANUFACTURING A SEMICONDUCTOR DEVICE

BACKGROUND

Semiconductor devices based on vertical IGFET (insulated gate field effect transistor) cells include cell trench structures with buried electrodes and semiconductor mesas between the cell trench structures. Typically a photolithographic mask defines placement and size of the cell trench structures and another photolithographic mask defines placement and size of contact structures providing electric contacts to impurity zones in the semiconductor mesas. Other approaches rely on forming the contact structures self-aligned to the cell trench structures. It is desirable to provide semiconductor devices with narrow semiconductor mesas and small distances between neighboring cell trench structures in a reliable way and at low costs.

SUMMARY

According to an embodiment, a method of manufacturing a semiconductor device is provided. First and second cell trench structures are provided that extend from a first surface into a semiconductor substrate. The first cell trench structure includes a first buried electrode and a first insulator layer between the first buried electrode and a semiconductor mesa separating the first and second cell trench structures. A capping layer is provided that covers the first surface. The capping layer is patterned to form an opening having a minimum width that is larger than a thickness of the first insulator layer. The opening exposes a first vertical section of the first insulator layer at the first surface. An exposed portion of the first insulator layer is removed to form a recess between the semiconductor mesa and the first buried electrode. A contact structure is provided in the opening and the recess.

According to another embodiment, a method of manufacturing a semiconductor device includes introducing first and second cell trenches from a first surface into a semiconductor substrate, wherein first semiconductor mesas are formed between first and second cell trenches and second semiconductor mesas are formed between the first cell trenches. A first insulator layer is provided that lines at least sidewalls of the first cell trenches. First buried electrodes are provided in the first cell trenches on the first insulator layer. A capping layer is provided that covers the first surface. The capping layer is patterned to form first and second openings having a minimum width that is larger than a thickness of the first insulator layer. The first openings expose first vertical sections of the first insulator layers adjoining the first semiconductor mesas, respectively. The second openings expose the first buried electrodes of first cell trenches located between second semiconductor mesas. Exposed portions of the first insulator layers are removed to form recesses between the first semiconductor mesas and adjoining ones of the first buried electrodes. Conductive material is deposited to form, in the recesses and the first openings, first contact structures and second contact structures in the second openings.

Another embodiment refers to a semiconductor device with first and second cell trench structures extending from a first surface into a semiconductor substrate. First semiconductor mesas separate first and second cell trench structures and second semiconductor mesas separate first cell trench structures. The first cell trench structures include a first buried electrode and a first insulator layer respectively, wherein first vertical sections of the first insulator layers separate the first buried electrodes from the first semiconductor mesas. A capping layer is located on the first surface. The semiconductor device includes first contact structures, wherein each first contact structure includes a first section in an opening of the capping layer and a second section between one of the first semiconductor mesas and one of the first buried electrodes directly adjoining the respective first semiconductor mesa.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the embodiment. Other embodiments and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise. The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D refer to a semiconductor substrate 500a consisting of or containing a semiconductor layer 100a of a single-crystalline semiconductor material. The single-crystalline semiconductor material may be silicon Si, silicon carbide SiC, germanium Ge, a silicon germanium crystal SiGe, gallium nitride GaN or gallium arsenide GaAs. The semiconductor substrate 500a may be a silicon wafer from which a plurality of identical semiconductor dies is obtained. The semiconductor layer 100a has a planar first surface 101 and a second surface 102 parallel to the first surface 101. The normal to the first and second surfaces 101, 102 defines a vertical direction and directions orthogonal to the vertical direction are lateral directions.

Figure 1A:
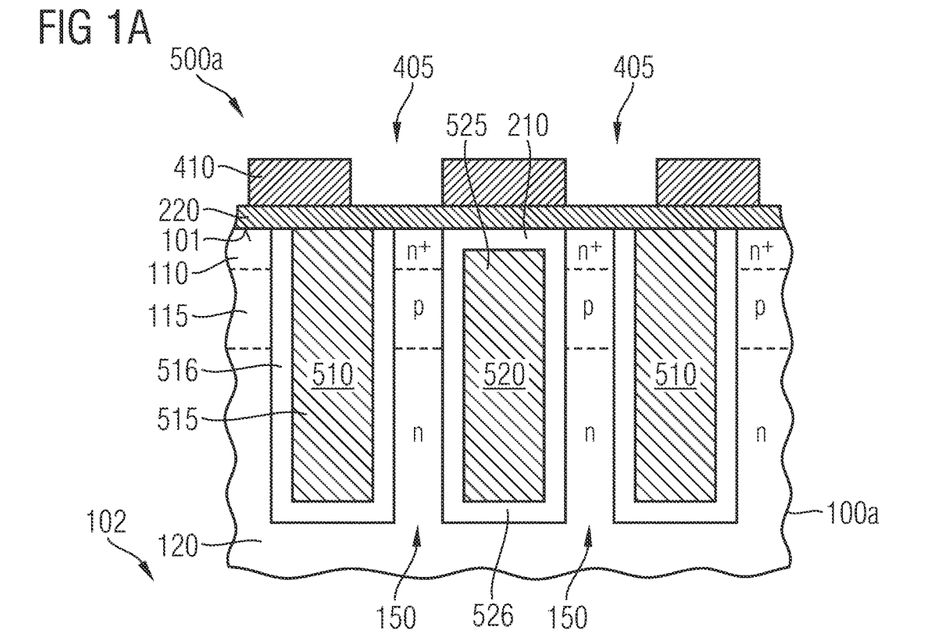
FIG. 1A is a schematic cross-sectional view of a portion of a semiconductor substrate after providing an etch mask.

In at least a portion of the semiconductor substrate 500a, a first layer of a first conductivity type may be formed that directly adjoins the first surface 101. The first layer of the first conductivity type may form a planar interface with a layer of a second, complementary conductivity type that separates the first layer of the first conductivity type from a second layer of the first conductivity type. The interfaces between the layers may be parallel to the first surface 101.

The first conductivity type may be the n type and the second conductivity type may be the p type as illustrated in the Figures. According to other embodiments the first conductivity type may be the p type and the second conductivity type may be the n type. Outside the illustrated portion, the semiconductor layer 100a may include further impurity zones, intrinsic zones, as well as dielectric and conductive structures that may be configured to form electric circuits.

First and second cell trench structures 510, 520 extend from the first surface 101 into the semiconductor substrate 500a, wherein buried edges of the first and second cell trench structures have a greater distance to the first surface 101 than a pn junction between the layer of the second conductivity type and the second layer of the first conductivity type. The cell trench structures 510, 520 provide segments in the first layer of the first conductivity type and the layer of the second conductivity type such that semiconductor mesas 150 between the first and second cell trench structures 510, 520 have a layered structure with source zones 110 of the first conductivity type directly adjoining the first surface 101 and body zones 115 of the second conductivity type separating the source zones 110 from portions of a drift layer 120 of the first conductivity type.

The first cell trench structures 510 include at least a first buried electrode 515 and a first insulator layer 516 separating the first buried electrode 515 from the semiconductor material of the semiconductor substrate 500a outside the first and second cell trench structures 510, 520.

Each second cell trench structure 520 includes a second buried electrode 525 and a second insulator layer 526 separating the second buried electrode 525 from the semiconductor material of the semiconductor substrate 500a outside the cell trench structures 510, 520. At least one of the first and second cell trench structures 510, 520 may include a further buried electrode dielectrically insulated from the respective first or second buried electrode 515, 525.

The first and second cell trench structures 510, 520 may have the same vertical and lateral dimensions. According to other embodiments the first cell trench structures 510 are wider or narrower than the second cell trench structures 520. Alternatively or in addition, the vertical extension of the first cell trench structures 510 exceeds or falls below the vertical extension of the second cell trench structures 520. According to an embodiment, the vertical extension of both the first and the second cell trench structures 510, 520 may be in a range from 500 nm to 20 μm, e.g. in a range from 2 μm to 7 μm.

The first and second buried electrodes 515, 525 and, if applicable, the further buried electrode(s) may be provided from one or more conductive materials including polycrystalline silicon (polysilicon), which may be heavily doped, metal silicides, carbon C, metals, e.g. copper or tungsten, metal alloys, metal nitrides, metal silicides or other metal compounds, e.g. titanium nitride TiN, titanium tungstenide TiW, tantalum nitride TaN and others. For example, the first, the second, or both buried electrodes 515, 516 have a layered structure including two or more layers of the above-mentioned materials. The first and second buried electrodes 515, 516 may have the same structure and may contain the same materials or may have different structures and/or contain different materials.

The first and second insulator layers 516, 526 may have the same thickness or may have different thicknesses. For example, the first insulator layer 516 may be thicker than the second insulator layer 526. The first and second insulator layers 516, 526 may be based on the same materials or may consist of or may include different materials such as semiconductor oxides, e.g. silicon oxide, silicon nitride, alumina, and hafnium oxide, by way of example. According to an embodiment, at least one of the first and second insulator layers 516, 526 has a layered structure including one or more different dielectric materials. A thickness of the first and second insulator layers may be between 30 nm and 200 nm, e.g. in the range between 80 nm and 120 nm. The second cell trench structure 520 may include a capping dielectric 210 between the first surface 101 and the second buried electrode 525. The first cell trench structure 510 may or may not include a structure corresponding to the capping dielectric 210.

The first and second buried electrodes 515, 525 may be electrically connected to each other. According to the illustrated embodiment the first and second buried electrodes 515, 525 are electrically separated from each other and can be connected to different signals or potentials. A potential applied to the second buried electrodes 525 may control the charge carrier distribution in the adjoining body zones 115 such that along the second insulator layers 526 a conductive channel may be formed when the potential applied to the second buried electrodes 525 exceeds a predefined threshold voltage. Sections of the second insulator layers 526 adjoining the body zones 115 are effective as gate dielectrics.

A capping layer 220 is provided on the first surface 101 and covers the first and second cell trench structures 510, 520 as well as the semiconductor mesas 150. The capping layer 220 includes one or more dielectric layers, each layer provided, for example, from deposited semiconductor oxide, for example a silicon oxide generated by using TEOS (tetraethyl orthosilicate) as precursor material, other silicon oxides, silicon nitride, or silicon oxynitride. The thickness of the capping layer 220 may be approximately uniform and may range from about 100 nm to 1 μm, by way of example.

A photo resist layer is deposited on the capping layer 220 and patterned by photolithographic techniques to form an etch mask 410.

FIG. 1A shows the capping layer 220 covering the first and second cell trench structures 510, 520 and the semiconductor mesas 150 between the first and second cell trench structures 510, 520. Mask openings 405 in the etch mask 410 expose portions of the capping layer 220 in the vertical projection of first vertical sections of the first insulator layers 516, wherein the first vertical sections adjoin such semiconductor mesas 150 that separate first and second cell trench structures 510, 520. The mask openings 405 also expose portions of the capping layer 220 in the vertical projection of portions of the semiconductor mesas 150 directly adjoining the concerned sections of the first insulator layers 516 as well as portions of the capping layer 220 in the vertical projection of a portion of the first buried electrode 515 directly adjoining the concerned sections of the first insulator layer 516.

The etch mask 410 covers portions of the capping layer 220 in the vertical projection of the second cell trench structures 520 as well as portions of the capping layer 220 in the vertical projection of second vertical sections of the first insulator layers 516 adjoining semiconductor mesas 150 between first cell trench structures 510. Using the etch mask 410, a predominantly anisotropic etch recesses the exposed portions of the capping layer 220. The etch removes the material of the capping layer 220 at a higher rate than the single crystalline semiconductor material of the semiconductor mesas 150 and the material of the first buried electrodes 515. The etch process may include an endpoint detection sensitive to reaching at least one of the semiconductor mesas 150, the first vertical sections of the first insulator layer 516, and the first buried electrode 515.

Figure 1B:
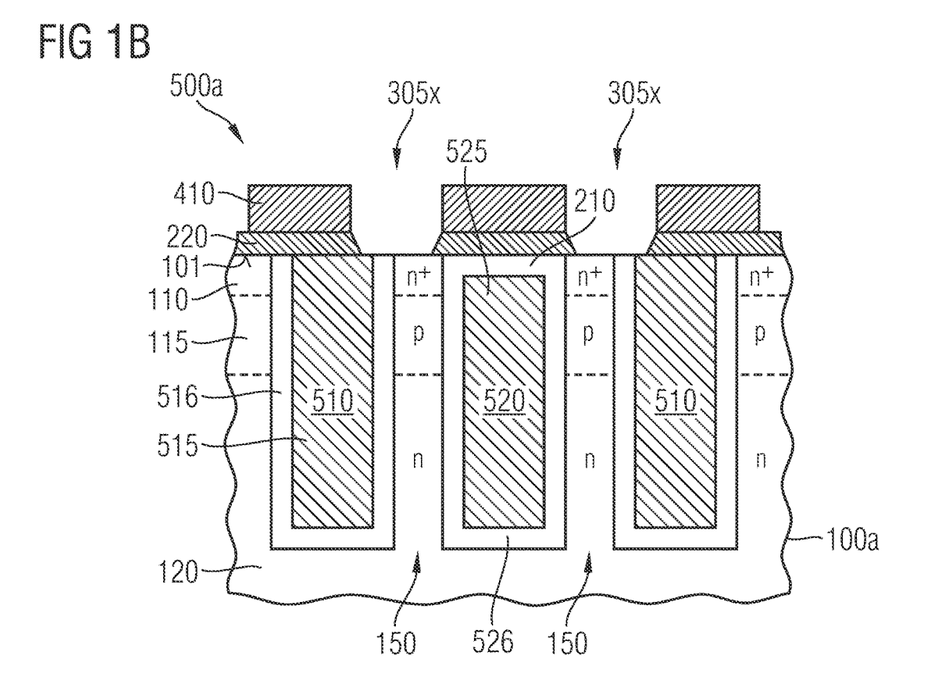
FIG. 1B is a schematic cross-sectional view of the semiconductor substrate portion of FIG. 1A after providing openings in a capping layer by using the etch mask.

FIG. 1B shows openings 305*x* in the capping layer 220 after the etching has reached the first surface 101. The openings 305*x* expose the first vertical sections of the first insulator layers 516, portions of the first buried electrodes 515 directly adjoining the concerned sections of the first insulator layers 516 and portions of semiconductor mesas 150 directly adjoining the concerned sections of the first insulator layers 516.

After detecting the endpoint, an in-situ over etch may be performed for a predefined time to recess the exposed first vertical sections of the first insulator layers 516. The recess etch removes exposed portions of the first insulator layers 516 up to a second distance to the first surface 101, which is greater than a first distance between the first surface 101 and the interface between the source and body zones 110, 115 and which is smaller than a third distance between the first surface 101 and the interface between the body zones 115 and the drift layer 120. The second distance may be at least 200 nm and at most 1 μm, e.g. between 400 μm and 600 μm. The material of the first insulator layer 516 is recessed at a removal rate that may be at least five times the removal rate for the semiconductor material and/or the material of the first buried electrode 515.

Figure 1C:
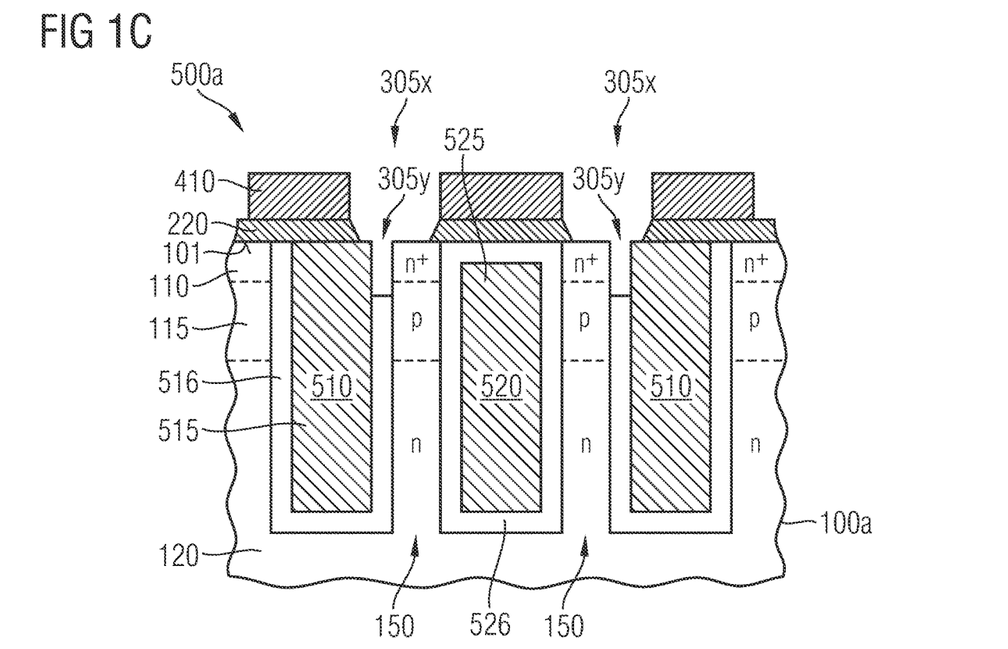
FIG. 1C is a schematic cross-sectional view of the semiconductor substrate portion of FIG. 1B after forming recesses between first cell trench structures and first semiconductor mesas.

FIG. 1C shows the resulting recesses 305*y* between the concerned first buried electrodes 515 and the concerned semiconductor mesas 150. Due to the selectivity of the etch of the insulator layer 516, the recesses are self-aligned within the openings 305*x* to the first cell trench structures 510 and the concerned semiconductor mesas 150. In the layout, the width of the semiconductor mesas 150 may be further reduced, e.g. to below 400 nm.

Whereas conventional approaches provide a first etch process through the material of a capping layer and a second etch process for providing contact grooves in the semiconductor materials of semiconductor mesas and buried electrodes, the present embodiment provides one combined etch for openings in the capping layer and recesses along the semiconductor mesas 150. The combined etch may be performed as one in-situ process at the same tool.

Figure 1D:
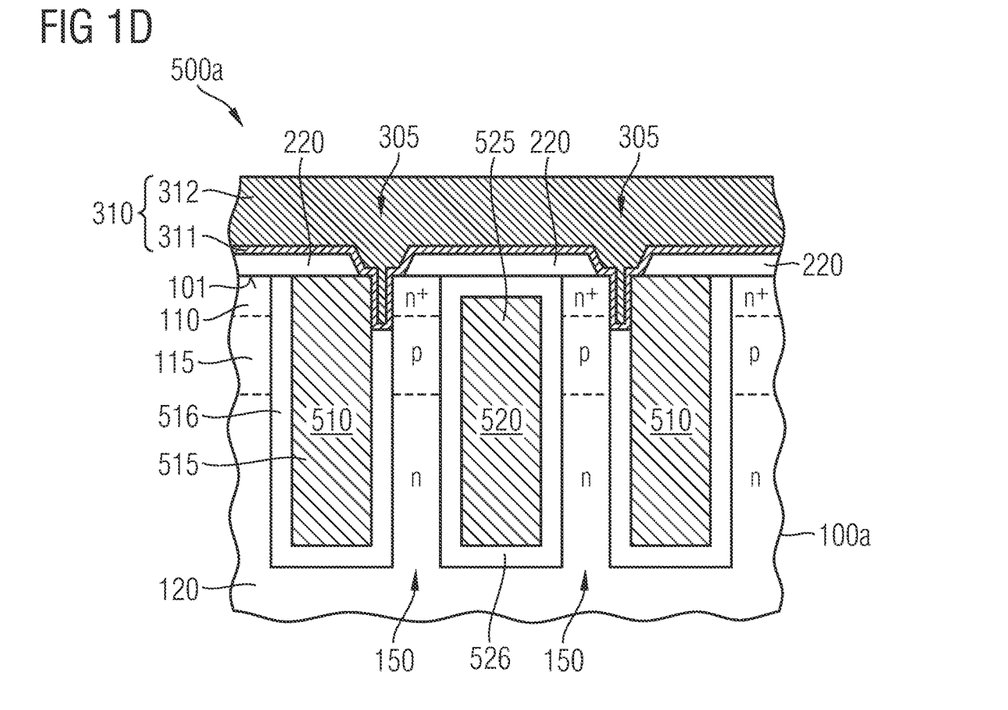
FIG. 1D is a schematic cross-sectional view of the semiconductor substrate portion of FIG. 1C after providing solid contact structures filling the openings and the recesses.

One or more conductive materials are deposited to form a first electrode structure 310 on the side of the semiconductor substrate 500*a* defined by the first surface 101 as well as contact structures 305 electrically connecting the first electrode structure 310 with the first buried electrodes 515, the body zones 115 and the source zones 110 of the semiconductor mesas 150 that separate first and second cell trench structures 510, 520. Providing the first electrode structure 310 may include successive deposition of one or more conductive materials.

According to an embodiment, a barrier layer 311 having a uniform thickness in the range of 5 nm to 100 nm may be deposited. The bather layer may bar metal atoms from diffusing into the semiconductor substrate 500*a* and may be a layer of titanium nitride TiN, tantalum nitride TaN, titanium tungstenide TiW, titanium Ti or tantalum Ta, or may include these materials.

A main layer 312 may be deposited on the barrier layer 311. The main layer 312 may consist of or contain tungsten or tungsten based metals such as titanium tungstenide TiW, heavily doped polysilicon, carbon C, aluminum Al, copper Cu or alloys of aluminum and copper, such as AlCu or AlSiCu. At least one of the layers may be provided with a porous structure or may be deposited in a way to form voids or small cavities within the recesses 305*y* and/or the openings 305*x*. Voids and cavities in the recesses 305*y*, and openings 305*x* reduce mechanical stress.

FIG. 1D shows the first electrode structure 310 including the barrier layer 311 and the main layer 312. The thickness of the barrier layer 311 may be less than a half of the width of the recess 305*y* in FIG. 1C. According to another embodiment, the barrier layer 311 fills the recess 305*y* completely.

The materials of the main layer 312 and the barrier layer 311 may fill the openings 305x in the capping layer 220 and the recesses 305y in the semiconductor portion 100 completely to form solid contact structures 315 as shown in FIG. 1D.

Figure 2:
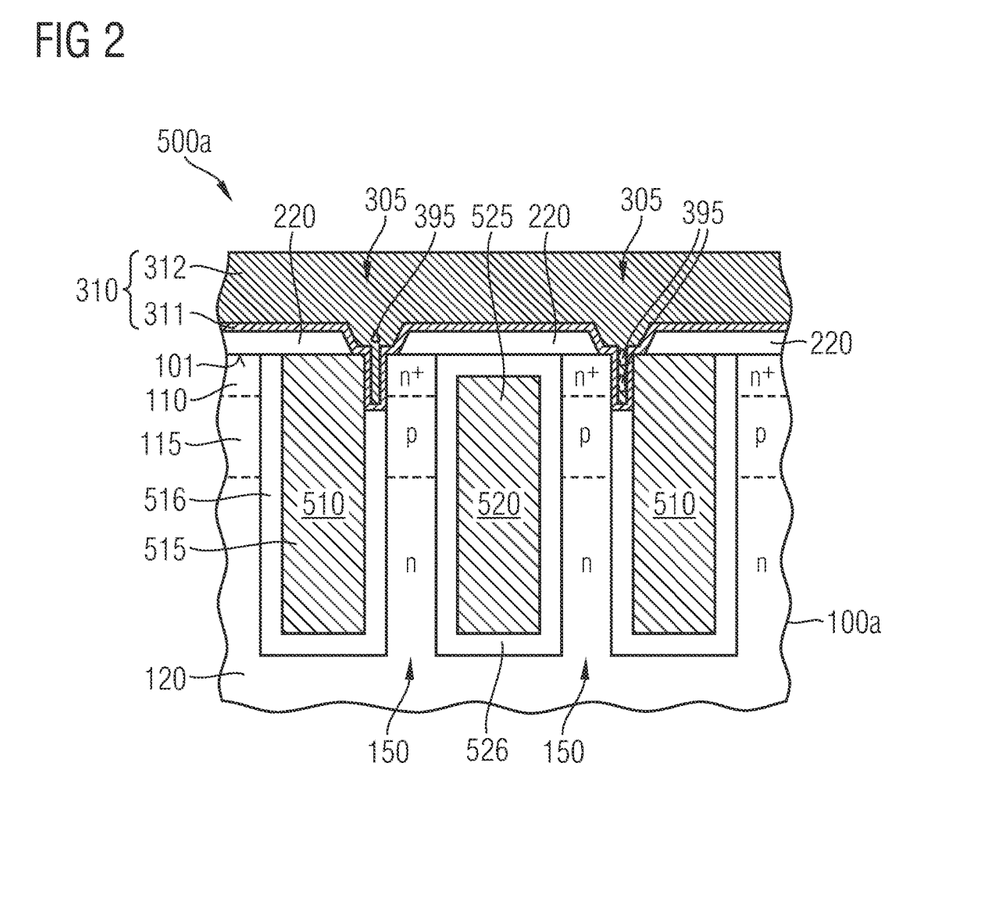
FIG. 2 is a schematic cross-sectional view of the semiconductor substrate portion of FIG. 1C after providing contact structures with voids in the openings and the recesses.

FIG. 2 is related to other embodiments with the main layer 312 leaving voids 395 in the recesses 305y and the openings 305x.

Figure 3A:
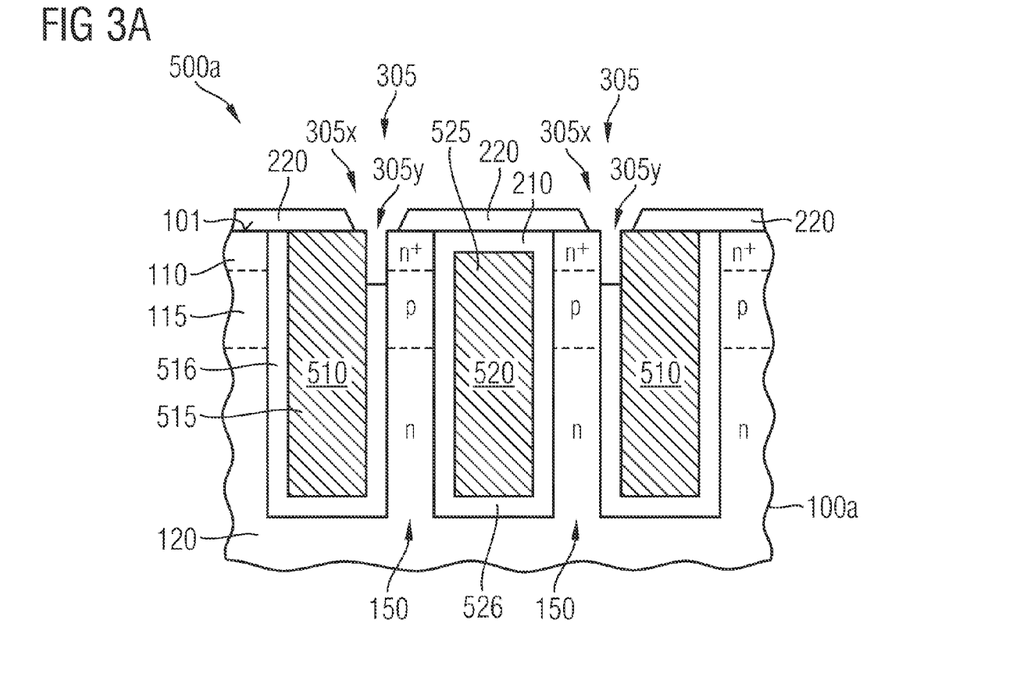
FIG. 3A shows a portion of a semiconductor substrate after providing recesses between a first buried electrode and first semiconductor mesas.
Figure 3B:
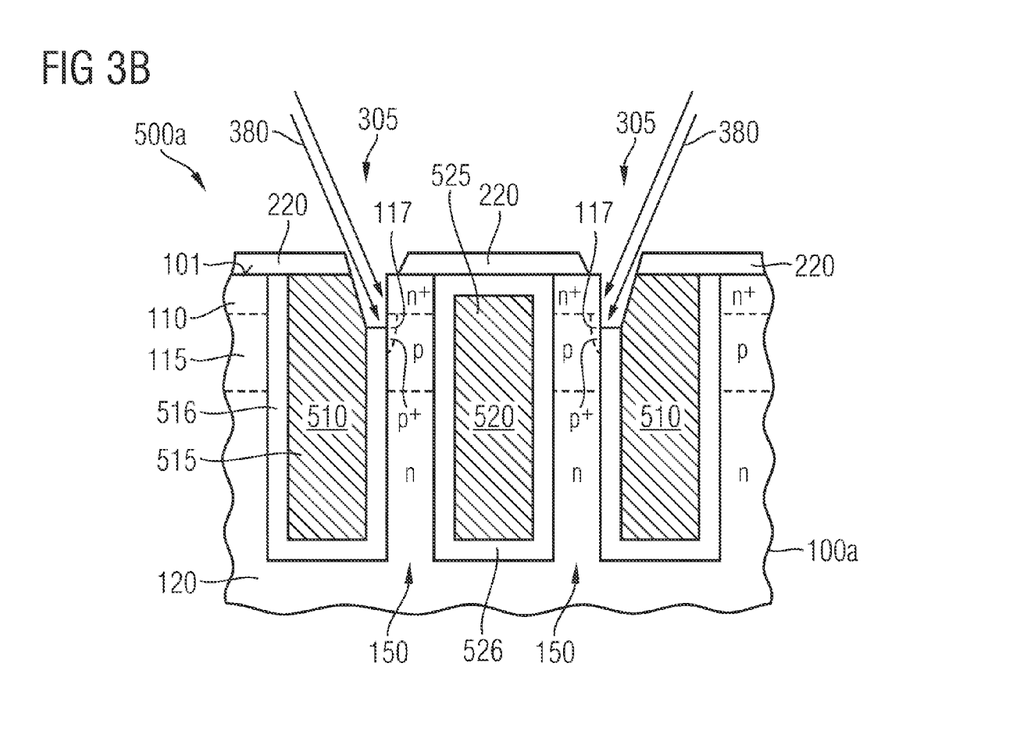
FIG. 3B shows the semiconductor substrate portion of FIG. 3A after widening the recesses.
Figure 3C:
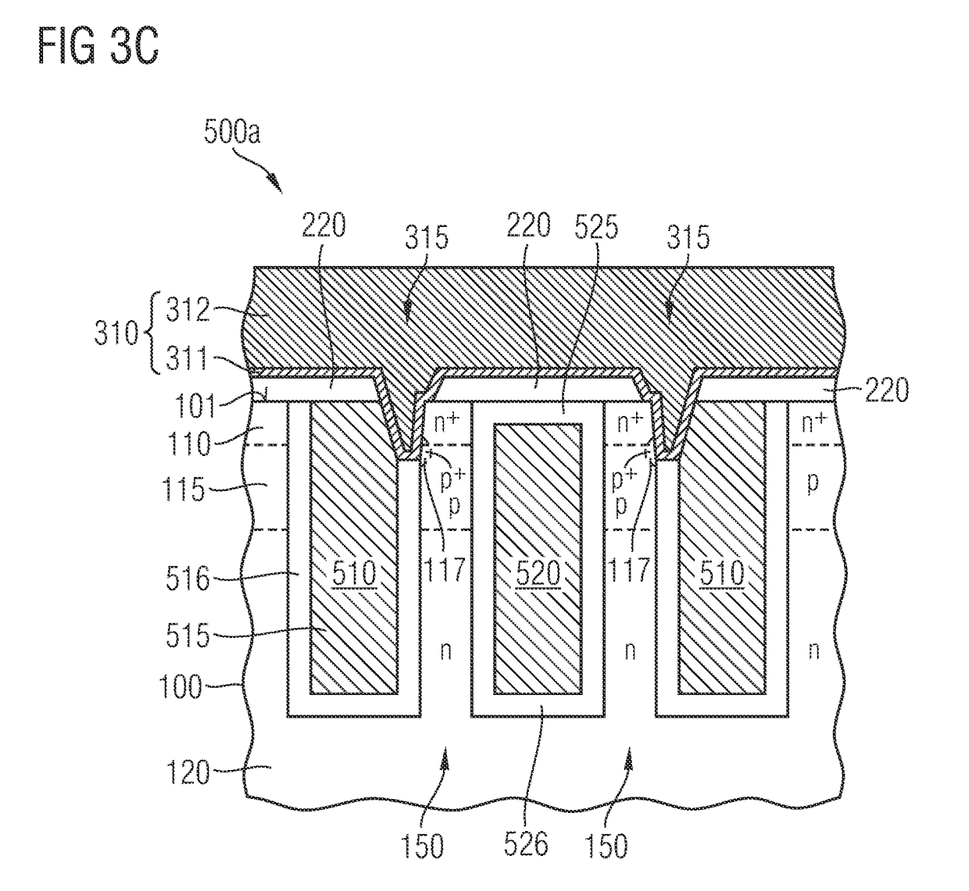
FIG. 3C illustrates the semiconductor substrate portion of FIG. 2B after providing contact structures in the openings and widened recesses.

FIGS. 3A to 3C refer to an embodiment that includes a widening of the recesses 305y. In first sections of first insulator layers 516 between first buried electrodes 515 and such semiconductor mesas 150 that are formed between first and second cell trench structures 510, 520 and that are exposed by openings 305x in a capping layer 220, recesses 305y may be formed between the first buried electrodes 515 and the concerned semiconductor mesas 150. An etch selectivity at which the material of the buried first electrode 515 is removed with respect to the material of the semiconductor mesa 150 may be at least 5:1. The etch mask may be removed.

FIG. 3A shows the openings 305x in the capping layer 220 and the recesses 305y between the first buried electrodes 515 and the concerned semiconductor mesas 150. Contact openings 305 include an opening 305x and a recess 305y, respectively. A first etch step forms the opening 305 in the capping layer 220 and may stop at the first surface 101. A second etch step that may use the same etch process overetches the first insulator layer 316 for a predetermined time. Using a different etch process, a third etch step widens at least the openings of the recesses 305y at the expense of either the adjoining semiconductor mesas 150 or the adjoining portions of the first buried electrodes 515 or both. For example, a short isotropic silicon etch may remove polycrystalline material, which may be used for the first buried electrodes 515, at a higher etch rate than the single crystalline semiconductor material of the semiconductor mesas 150.

According to another embodiment, a first etch process forms the openings 305 in the capping layer 220 and stops at the first surface 101. A second etch step forms wide recesses 305y by using an etch process with lower selectivity than the first etch process such that a certain amount of the first buried electrodes 515 is recessed contemporaneously with the material of the first insulator layer 516. As a result, the width of the semiconductor mesas 150 can be essentially maintained such that a channel portion along the second cell trench structure 520 remains unaffected from processes applied at the recesses 305y.

According to another embodiment, the etch selectivity of the process for generating the recesses 305y is gradually reduced with time such that the sidewall angles of the recess 305y become less steep. In both cases, the etch rate may be higher in the polycrystalline silicon material, which may be used for the first buried electrodes 515, than in the single crystalline semiconductor material of the semiconductor mesas 150. Processes widening the recesses 305y ease the later filling of the recesses 305y with the one or more contact materials without significantly reducing the dimensions of the semiconductor mesas 150.

According to an embodiment, an implant may be performed through the sidewalls of the recesses 305y to reduce a contact resistance to the body zones 115 and the risk of latch-up effects. For example, a BF2 implant may be performed. The implant may be activated through an RTA (rapid thermal anneal) to form heavily doped contact zones 117 along the sidewall portions of the semiconductor mesas 150 exposed by the widened recesses 305y. The contact zones 117 have the second conductivity type and do not reach the second cell trench structures 520 such that a variation of a threshold voltage due to impurities of the BF2 implant reaching the channel along the second insulator layer 526 can be avoided.

According to another embodiment, a plasma implant may be performed through the sidewalls of the widened recesses 305y to form conformal contact zones 117. Since the plasma implant counter-dopes portions of the source zones 110, the source zones 110 are provided with a sufficient high net impurity concentration.

FIG. 3B shows an angled implant 380 for introducing impurities of the second conductivity type into exposed sidewall portions of the semiconductor mesas 150 and the heavily doped contact zones 117 of the second conductivity type emerging from the angled implant 380 after anneal. In the case of tapered recesses 305y, the implant 380 may be an orthogonal implant perpendicular to the first surface 101. Otherwise, the implant angle with respect to the normal may be greater 0 degrees.

A barrier layer 311 may be deposited on the capping layer 220, wherein the barrier layer 311 lines the combined contact openings 305. A main layer 312 is deposited that may fill the contact openings 305 completely or that may leave voids in the contact openings 305.

FIG. 3C shows the first electrode structure 310 and the contact structures 315 formed in the contact openings 305. A slope of the contact openings 305 at a side oriented to the concerned semiconductor mesa 150 is steeper than a slope at the opposing side oriented to the concerned first buried electrode 515.

FIGS. 4A to 4D illustrate a semiconductor device 500 obtained from one of a plurality of identical semiconductor dies processed as a portion of the semiconductor substrate 500a of FIGS. 1A to 1D. The semiconductor device 500 may be a power switching device, e.g. an IGBT (insulated gate bipolar transistor) e.g. a PT-IGBT (punch through IGBT) or an IGFET.

Figure 4A:
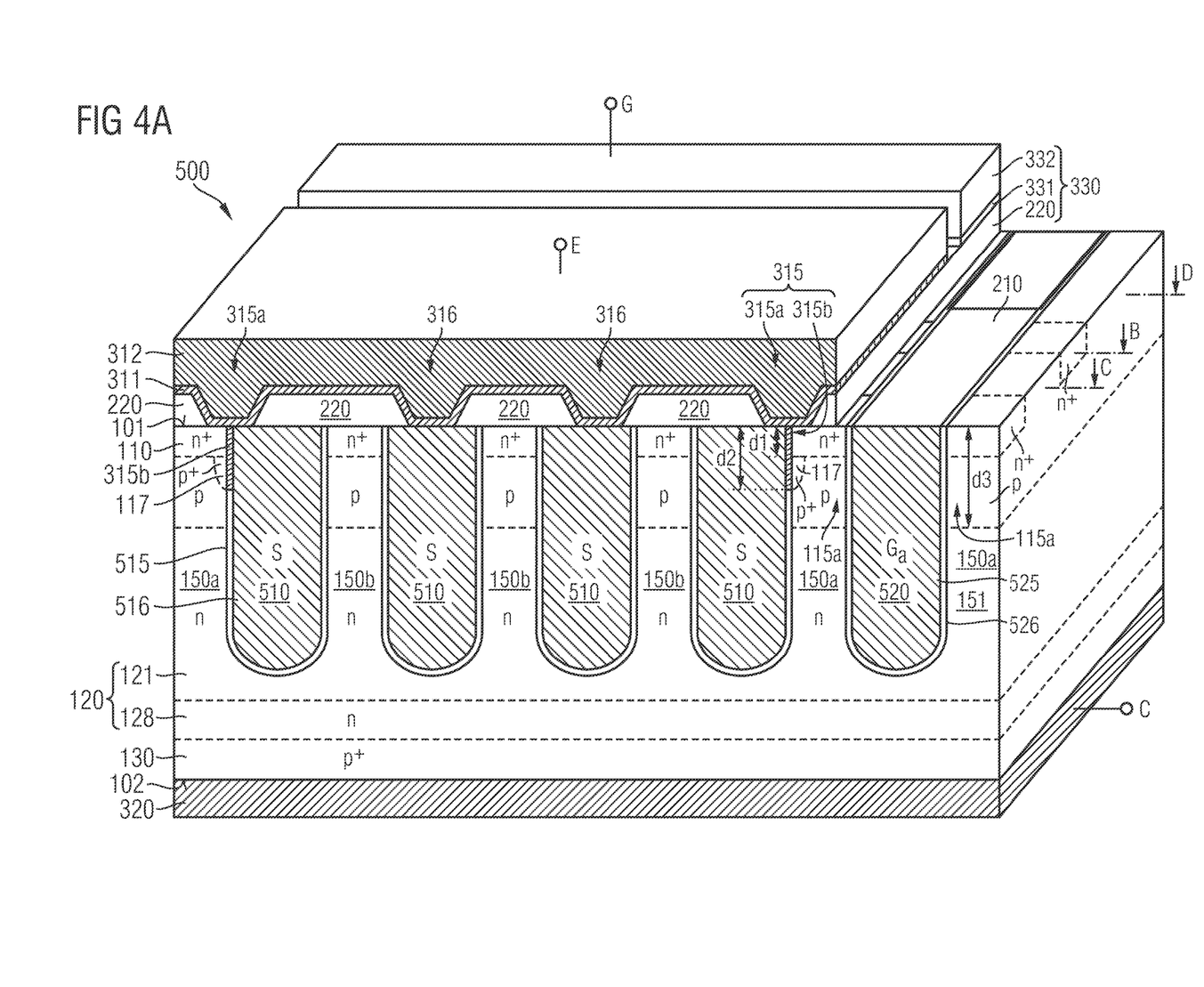
FIG. 4A is a schematic perspective view of a portion of semiconductor device in accordance with an embodiment related to an IGBT.
Figure 4B:
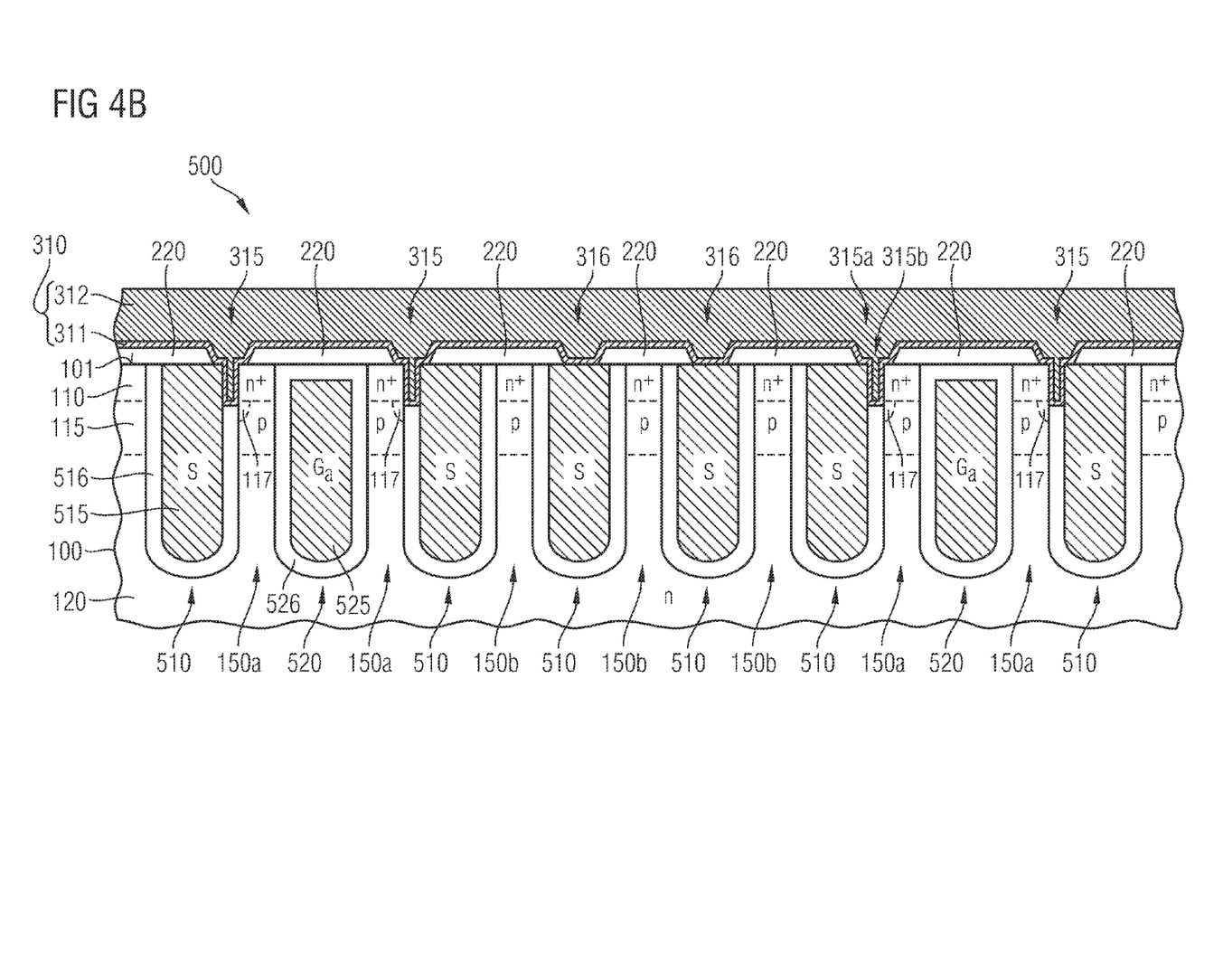
FIG. 4B illustrates a cross section of the semiconductor devices of FIG. 4A along section line B.
Figure 4C:
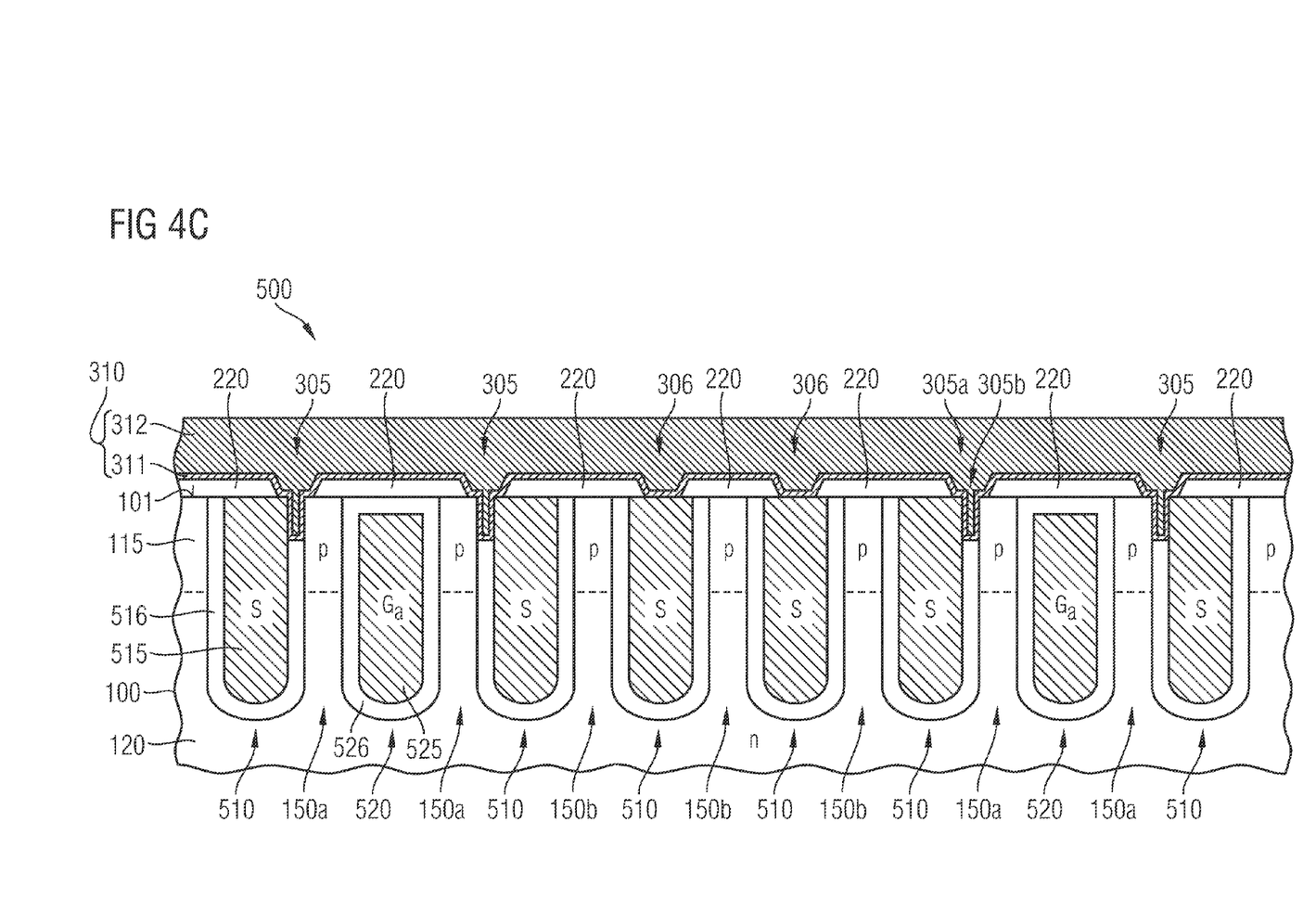
FIG. 4C illustrates a section of the semiconductor devices of FIG. 4A along cross section line C.
Figure 4D:
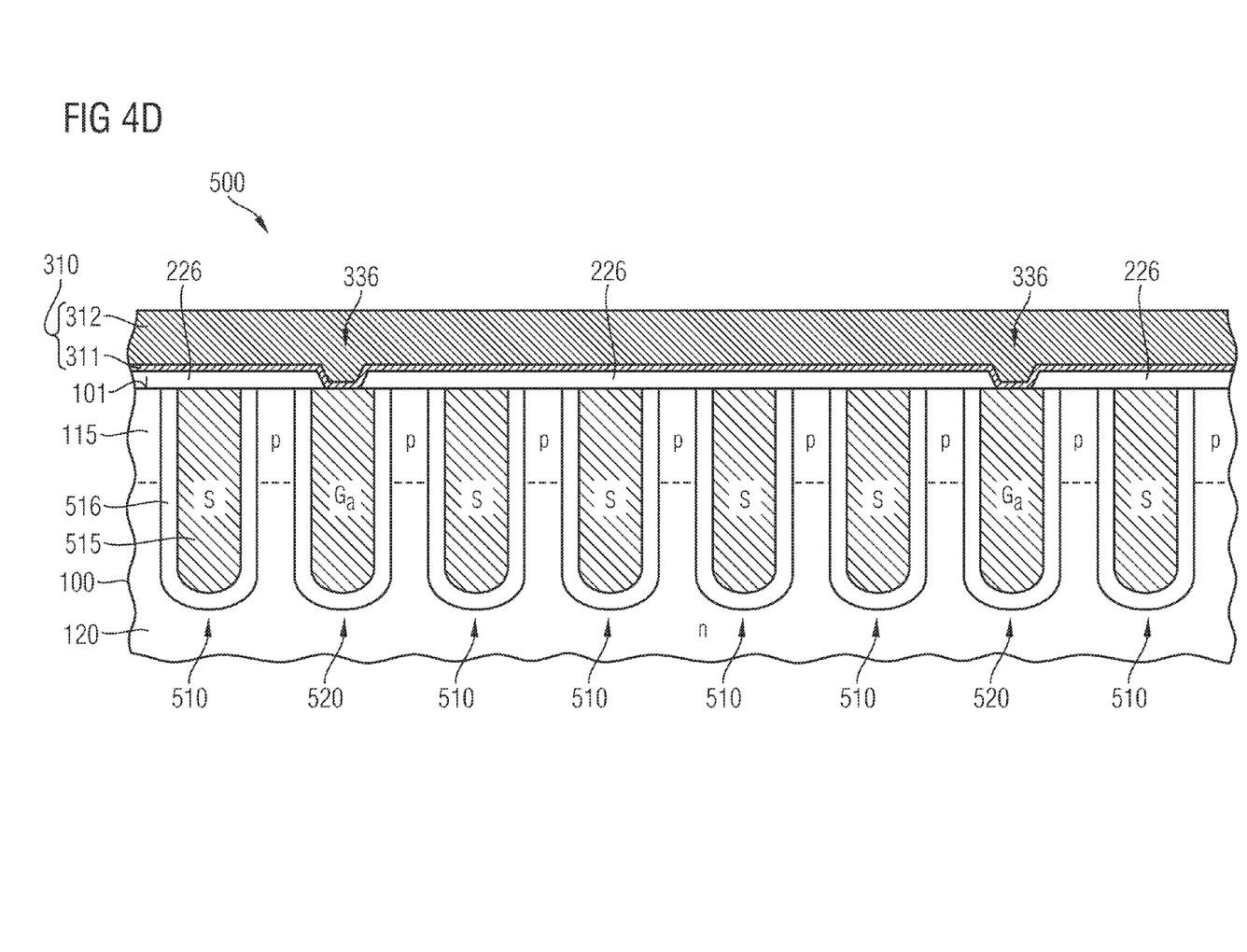
FIG. 4D illustrates a section of the semiconductor devices of FIG. 4A along cross section line D.

The semiconductor device 500 includes a semiconductor portion 100 with a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A minimum distance between the first and second surfaces 101, 102 is selected to achieve a specified voltage blocking capability of the drift zone 120, for example 90 to 110 μm for a 1200 V blocking IGBT. Other embodiments related to higher blocking devices or PT-IGBT device approaches may provide semiconductor portions 100 with a thickness of several 100 μm distances between 101 and 102. Low voltage IGFETs may be thinner, e.g. at least some 10 μm.

The semiconductor portion 100 may have a rectangular shape with an edge length in the range of several millimeters. The normal to the first and second surfaces 101, 102 defines a vertical direction and directions orthogonal to the normal direction are lateral directions.

First and second cell trench structures 510, 520 extend from the first surface 101 into the semiconductor portion 100. The first and second cell trench structures 510, 520 may have the same vertical dimensions and the same lateral dimensions. According to other embodiments, the lateral and/or vertical dimensions of the first and second cell trench structures 510, 520 differ from each other. The vertical extension may be in the range from 500 nm to 20 μm, e.g. from 2 μm to 7 μm. The lateral width may be less than 2 μm, e.g. less than 1.2 μm.

The first cell trench structures 510 comprise first buried electrodes 515 and first insulator layers 516 separating the first buried electrodes 515 from the semiconductor material outside the first and second cell trench structures 510, 520. The first insulator layers 516 may have a uniform thickness in a range from 50 nm to 150 nm, e.g. between 80 nm and 120 nm, by way of example. The first cell trench structures 510 may or may not include further conductive structures, e.g. a further electrode dielectrically insulated from the first buried electrodes 515.

The second cell trench structures 520 include second buried electrodes 525 and second insulator layers 526 dielectrically insulating the second buried electrodes 525 from the semiconductor material outside the first and second cell trench structures 510, 520. The second cell trench structures 520 may include a further conductive structure, for example a further electrode dielectrically insulated from the second buried electrodes 525. The number of first and second cell trench structures 510, 520 may be equal. Other embodiments provide more first cell trench structures 510 than second cell trench structures 520. For example, at least two first cell trench structures 510 are provided between two second cell trench structures 520, respectively. The semiconductor mesas 150 between second cell trench structures 520 may or may not be connected to the source potential.

The first and second cell trench structures 510, 520 may be parallel stripes arranged in a regular pattern. According to other embodiments, the lateral cross-sectional areas of the cell trench structures 510, 520 may be circles, ellipses, ovals or rectangles, e.g. squares, with or without rounded corners, or rings. For example, two or three of the first and second cell trench structures 510, 520 may form an arrangement with two or three concentric rings, wherein the rings may be circles, ellipses, ovals, or rectangles, e.g. squares with or without rounded corners.

IGBT cells may be formed in the semiconductor portion 100 at a side oriented to the first surface 101, wherein active areas of the IGBT cells are formed in first semiconductor mesas 150a separating one first cell trench structure 510 and one second cell trench structure 520, respectively. In the first semiconductor mesas 150a, source zones 110 of the first conductivity type may directly adjoin the first surface 101. The source zones 110 form first pn junctions with body zones 115 of the second conductivity type, wherein interfaces between the source and body zones 110, 115 run approximately parallel to the first surface 101 at a first distance d1. The body zones 115 form second pn junctions with a drift layer 120 of the first conductivity type at a third distance d3 to the first surface 101. The first and second cell trench structures 510, 520 extend through the source zones 110 and the body zones 115 into the drift layer 120.

The illustrated embodiment refers to a fieldstop IGBT and the semiconductor portion 100 includes a collector layer 130 that directly adjoins the second surface 102. The collector layer 130 may be a contiguous layer of the second conductivity type. According to other embodiments related to, e.g. reverse conducting IGBTs, the collector layer 130 may include first portions of the first conductivity type and second portions of the second conductivity type, wherein the first and second portions alternate in one lateral direction or in both lateral directions. A mean net impurity concentration in the collector layer 130 may be at least $1 \times 10^{16}$ cm$^{-3}$, for example at least $5 \times 10^{17}$ cm$^{-3}$.

A second electrode structure 320 directly adjoins the second surface 102. The second electrode structure 320 is electrically connected to the collector layer 130 and may consist of or contain, as main constituent(s) aluminum Al, copper Cu, or alloys of aluminum or copper, such as AlSi, AlCu or AlSiCu. According to other embodiments, the collector electrode 320 may contain one, two, three or more sub-layers, wherein each sub-layer contains, as main constituent(s), at least one of nickel Ni, titanium Ti, silver Ag, gold Au, tungsten W, platinum Pt and/or palladium Pd. For example, a sub-layer may contain a metal silicide, a metal nitride, or a metal alloy containing Ni, Ti, Ag, Au, W, Pt, and/or Pd. For IGBTs, the second electrode structure 320 provides a collector electrode that may provide or may be electrically connected to a collector terminal C of the semiconductor device 500.

In the drift layer 120, a field stop layer 128 may be provided between the collector layer 130 and a drift zone 121. A mean net impurity concentration in the field stop layer 128 may be between $5 \times 10^{15}$ cm$^{-3}$ and $1 \times 10^{17}$ cm$^{-3}$. The mean net impurity concentration in the drift zone 121 is lower than in the field stop layer 128. According to an embodiment, the mean net impurity concentration in the field stop layer 128 exceeds at least five times the mean net impurity concentration in the drift zone 121. The mean net impurity concentration in the drift zone 121 may be between $5 \times 10^{12}$ cm$^{-3}$ and $5 \times 10^{14}$ cm$^{-3}$, by way of example. For IGFETs, a heavily doped contact layer of the first conductivity type replaces the collector layer 130 and the second electrode structure 320 provides a drain electrode that may provide or may be electrically connected to a drain terminal of the semiconductor device 500.

The second buried electrodes 525 provide insulated gate electrodes Ga. A potential applied to the insulated gate electrodes Ga controls a minority charge carrier distribution in channel portions 115a of the body zones 115, wherein the channel portions 115a adjoin the second cell trench structures 520 between the source zones 110 and the drift layer 120. If in a forward biased mode the potential applied to the insulated gate electrodes Ga exceeds a predefined threshold voltage, inversion channels of the first conductivity type are formed in the body zones 115 along the second insulator layers 526, which are effective as gate dielectrics, and an on-state current flows between the source zones 110 and the drift layer 120. The insulated gate electrodes Ga may be electrically connected to a third electrode structure 330 that may provide or may be electrically connected or coupled to a gate terminal G of the semiconductor device 500.

Second semiconductor mesas 150b between first cell trench structures 510 may or may not include source zones 110. In the latter case, the body zones 115 may extend between the first surface 101 and the drift layer 120.

The first cell trench structures 510 provide buried source electrodes S that may be electrically connected to an emitter terminal E of the semiconductor device 500. The insulated gate electrodes Ga are insulated from the buried source electrodes S. At least the second cell trench structures 520 may include a capping dielectric 210 between the first surface 101 and the second buried electrodes 525 to reduce an overlap between the insulated gate electrodes Ga and the source zones 110. Other embodiments may provide contacts to some or all of the second semiconductor mesas 150b.

A dielectric capping layer 220 may dielectrically insulate at least the second cell trench structures 520 and the second semiconductor mesas 150b from a first electrode structure 310 disposed at a side defined by the first surface 101. First contact structures 315 electrically connect the first electrode structure 310 with the first semiconductor mesas 150a and such first cell trench structures 510 that directly adjoin the first semiconductor mesas 150a. Second contact structures 316 electrically connect the first electrode structure 310 with other first cell trench structures 510 not directly adjoining the first semiconductor mesas 150a.

Each of the first contact structures 315 includes a first section 315a in an opening of the capping layer 220 and a second section 315b between a first semiconductor mesa 150a and a first cell trench structure 510 directly adjoining the first semiconductor mesa 150a. The second section 315b extends from the first surface 101 into the semiconductor portion 100. A second distance d2 between the first surface 101 and the buried edge of the second section 315b is greater than the first distance d1 and smaller than the third distance d3.

The second sections 315b of the first contact structures 315 may have approximately vertical sidewalls. According to an embodiment, the sidewalls for the second sections 315b taper with increasing distance to the first surface 101.

According to an embodiment, first sidewalls of the second sections 315b of the first contact structures 315 are tilted to the first surface 101 and directly adjoin the first semiconductor mesas 150a. Second sidewalls of the second sections 315b of the first contact structures 315 may be tilted to the first surface 101 and directly adjoin the first buried electrodes 510. The first sidewalls oriented to the first semiconductor mesas 150 and the second sidewalls oriented to the first buried electrodes 510 may have identical slope angles. The second sidewalls may deviate to a higher degree from a normal to the first surface 101 than the first sidewalls of the second sections 315b of the first contact structures 315.

The second sections 315b of the first contact structures 315 are located in the vertical projection of first sections of the first insulator layers 516. The first insulator layers 516 may have a uniform width, wherein the width of the first insulator layers 516 may be equal to or less than a width of the second sections 315b of the first contact structures 315. The first contact structures 315 are deep enough to provide a direct contact to the body zones 115.

Heavily doped contact zones 117 may be formed in the body zones 115 of the first semiconductor mesas 150a along the interfaces to the first contact structures 315. The second electrode structure 310 as well as the third electrode structure 330 may include at least one barrier layer 311, 331, respectively. The barrier layer may have a uniform thickness in the range of 5 nm to 100 nm and may consist of or include a layer of titanium nitride TiN, tantalum nitride TaN, titanium tungstenide TiW, titanium Ti or tantalum Ta, by way of example. The main layers 312, 332 may consist of or contain tungsten or tungsten-based metals like titanium tungstenide TiW, heavily doped polysilicon, carbon C, aluminum Al, copper Cu or alloys of aluminum and copper, for example AlCu or AlSiCu.

The first and second contact structures 315, 316 may be solid contact structures, may include a porous layer or may have voids as shown in FIG. 2. The source zones 110 may be provided as narrow stripes and may alternate with portions of the body zones 115 in a lateral direction parallel to stripe shaped first and second cell trench structures 510, 520.

Uncertainties and inequalities of different lithographic layers resulting in a misalignment between contact structures and semiconductor mesas limit a minimal mesa width conventionally at about 600 nm. Instead, the semiconductor device 500 of FIGS. 4A to 4D facilitates narrowing the width of the semiconductor mesas to less than 300 nm, for example less than 200 nm.

Further embodiments concern layout modifications of the first and second trench structures 510, 520 to further reduce an effective channel width for increasing short-circuit ruggedness, e.g. by segmenting the second cell trench structures 520 or by increasing locally a thickness of the second insulator layers 526.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   first cell trench structures comprising a first buried electrode;
   second cell trench structures comprising a second buried electrode electrically separated from the first buried electrode, the first and second cell trench structures extending from a first surface into a semiconductor substrate,
   first semiconductor mesas separating first and second cell trench structures and comprising a source zone of a first conductivity type and a body zone of a second conductivity type that is complementary to the first conductivity type at a first distance to the first surface, the source zone extending along the first surface from the first cell trench structure to the second cell trench structure, and the body zone comprising a contact zone along a sidewall portion of the first semiconductor mesa,
   second semiconductor mesas separating first cell trench structures from each other, wherein the first cell trench structures comprise first insulator layers and first vertical sections of the first insulator layers separate the first buried electrodes from the first semiconductor mesas;
   a capping layer on the first surface, the capping layer sandwiched between an electrode structure and the second semiconductor mesas and structurally separating the electrode structure from the second semiconductor mesas; and
   first contact structures physically disconnected from the second semiconductor mesas, each first contact structure comprising a first section directly connected to the electrode structure in an opening of the capping layer and a second section sandwiched between one of the first semiconductor mesas and one of the first buried electrodes and directly adjoining the source and the contact zones in the respective first semiconductor mesa, wherein the first cell trench structure separates the second section from a neighboring one of the second semiconductor mesas, a vertical extension of the second section is greater than the first distance, and only one first contact structure is formed per first semiconductor mesa.

2. The semiconductor device of claim 1, wherein
   first sidewalls of the second sections of the first contact structures directly adjoin the first semiconductor mesas, and
   second sidewalls directly adjoin the first buried electrodes and at least the second sidewalls are tilted to the first surface by less than 90 degrees.

3. The semiconductor device of claim 2, wherein the first and second sidewalls taper with increasing distance to the first surface and the second sidewalls deviate to a higher degree from a normal to the first surface than the first sidewalls of the second sections of the first contact structures.

4. The semiconductor device of claim 1, further comprising second contact structures, each second contact structure formed in an opening of the capping layer and directly adjoining one of the first buried electrodes between two of the second semiconductor mesas.

5. The semiconductor device of claim 1, wherein the first insulator layer has a uniform width.

6. The semiconductor device of claim 1, wherein a width of the first insulator layer is equal to or less than a width of the second sections of the first contact structures.

7. The semiconductor device of claim 1, wherein the second sections of the first contact structures are located in a vertical projection of first vertical sections of the first insulator layers.

* * * * *